(12) United States Patent　　(10) Patent No.: US 9,160,342 B2
Troccoli　　(45) Date of Patent: Oct. 13, 2015

(54) NON-BINARY DECODER ARCHITECTURE AND CONTROL SIGNAL LOGIC FOR REDUCED CIRCUIT COMPLEXITY

(71) Applicant: NEXT BIOMETRICS GROUP ASA, Oslo (NO)

(72) Inventor: Matias N. Troccoli, Kirkland, WA (US)

(73) Assignee: NEXT BIOMETRICS GROUP ASA, Oslo (NO)

( * ) Notice: Subject to any disclaimer, the term of this patent is extended or adjusted under 35 U.S.C. 154(b) by 86 days.

(21) Appl. No.: 13/943,248

(22) Filed: Jul. 16, 2013

(65) Prior Publication Data

US 2013/0300457 A1　Nov. 14, 2013

Related U.S. Application Data

(62) Division of application No. 13/127,878, filed as application No. PCT/US2009/063202 on Nov. 4, 2009, now Pat. No. 8,502,563.

(60) Provisional application No. 61/111,382, filed on Nov. 5, 2008.

(51) Int. Cl.
　　*H03K 19/082*　　(2006.01)
　　*H03K 19/20*　　(2006.01)
　　*G11C 8/04*　　(2006.01)
　　*G11C 8/10*　　(2006.01)

(52) U.S. Cl.
　　CPC　*H03K 19/20* (2013.01); *G11C 8/04* (2013.01); *G11C 8/10* (2013.01)

(58) Field of Classification Search
　　CPC .................................. G11C 8/10; H03K 19/20

USPC ............................................ 326/93, 105–108
See application file for complete search history.

(56) References Cited

U.S. PATENT DOCUMENTS

| 6,091,837 | A | 7/2000 | Dinh |
| 6,108,438 | A * | 8/2000 | Bird et al. ..................... 382/124 |
| 6,288,941 | B1 | 9/2001 | Seki et al. |
| 6,408,421 | B1 | 6/2002 | Benes et al. |
| 6,633,656 | B1 | 10/2003 | Picard |
| 7,187,216 | B2 | 3/2007 | Sun et al. |
| 7,557,617 | B1 * | 7/2009 | Leung ........................... 326/105 |
| 7,738,314 | B2 * | 6/2010 | Terzioglu et al. ........ 365/230.06 |
| 2005/0104673 | A1 | 5/2005 | Okamura |

FOREIGN PATENT DOCUMENTS

| CN | 1180998 | 5/1998 |
| CN | 1444797 A | 9/2003 |
| WO | WO 2006/033582 A1 | 3/2006 |

OTHER PUBLICATIONS

International Search Report dated Dec. 15, 2009 in corresponding PCT Application No. PCT/US2009/063202.
The International Bureau of WIPO, International Preliminary Report on Patentability Issued May 10, 2011 in corresponding PCT Application No. PCT/US2009/063202.

* cited by examiner

*Primary Examiner* — Don Le
(74) *Attorney, Agent, or Firm* — Duane Morris LLP

(57) ABSTRACT

A decoder for sequentially enabling outputs in response to clock signal inputs is described including X number of logic stages corresponding to X number of outputs of the decoder. Each of the logic stages has a plurality of inputs, wherein each logic stage includes fewer than $\log_2 X$ inputs for receiving the clock signal inputs.

20 Claims, 5 Drawing Sheets

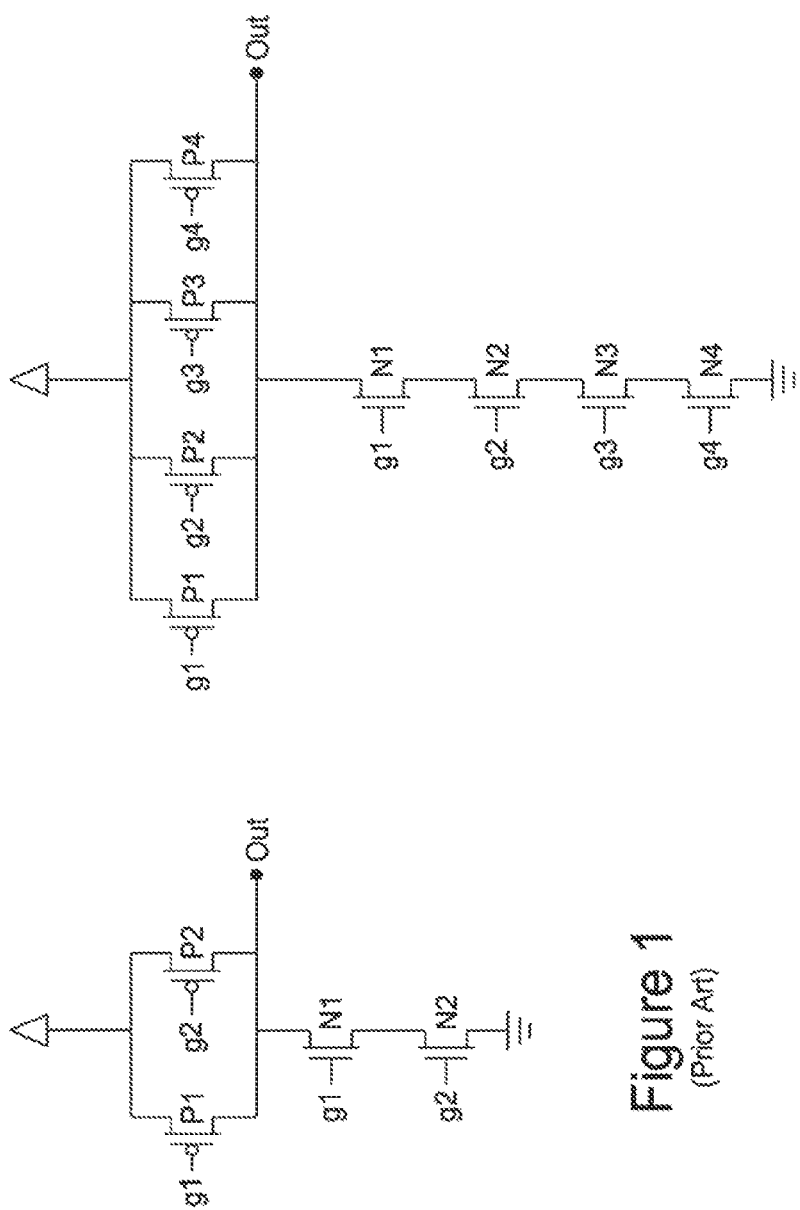

NON-BINARY DECODER ARCHITECTURE AND CONTROL SIGNAL LOGIC FOR REDUCED CIRCUIT COMPLEXITY

CROSS-REFERENCE TO RELATED APPLICATION

This application is a divisional application of and claims priority to U.S. patent application Ser. No. 13/127,878 filed May 5, 2011, which is a national stage application of International Application PCT/US2009/063202 filed Nov. 4, 2009, which claims priority to U.S. Provisional Patent Application No. 61/111,382 filed Nov. 5, 2008, the entirety of each of which is hereby incorporated by reference herein.

FIELD OF THE INVENTION

The present invention relates to decoder architectures for use with arrays of devices.

BACKGROUND OF THE INVENTION

Electronic arrays consist of identical devices arranged in rows and columns. Examples of these arrays include memory clusters, sensor arrays and display panels. The arrays are controlled by address circuits that select or activate (collectively referred to herein as "enable") the correct rows and columns of elements. These address circuits are usually located in close proximity to the array and have enabling outputs connected to respective row or column lines of the array. Addressing circuits belong to two families of circuits, namely shift registers and decoders. Shift registers allow for the sequential addressing of array lines. Shift registers include logic stages that enable only one of its outputs at a time but also trigger a successive stage. As such, the shift register activates adjacent array lines one after the other, making them suitable for large display or sensor systems. In contrast, decoders are composed of logic stages that require a specific combination of clocks representing a specific address at its input to enable a specific line output.

While shift register circuits tend to require fewer components and therefore occupy less space than decoders, they are prone to multiple stage failures, meaning there is a risk of a stage not being able to trigger the next stage, thereby rendering large blocks of lines useless. This characteristic of shift registers is a significant concern in low yield technologies. Decoders have stages that are independent of each other and failures can be contained to just one line or column. Furthermore, the arrays controlled by decoder circuits can be addressed in a non-sequential manner if desired. This is particularly useful in memory, sensor or display arrays that do not require every line to be enabled during a given cycle. The cost of this improved independence and reliability is found in the size and complexity of decoder structures.

Addressing circuits such as shift registers and decoders are particularly important in large area electronic arrays (such as displays and sensors). These circuits are suitable candidates for integration on the same substrate as the arrays that they control because this integration can reduce the number of interconnections to external components. Applications in this field are restricted for the most part to sensor or display arrays where yield, number of components and area utilization are very important. Shift registers are candidates for addressing these large arrays because of their reduced complexity when compared to decoders. But, because these applications usually extend over a large area, such as a display, it is particularly important to minimize failure regions. As discussed above, arrays controlled by shift registers are subject to consecutive line malfunctions, which severely affect the ability to localize failure regions. For this reason, it may be desirable to implement decoders that would limit potential failures to a single line or column. However, as discussed above, decoder stages necessarily employ complex circuit structures, particularly if the array size is large. This increased complexity affects yield as well as the ability to integrate the decoding structure with the array.

It is desirable, therefore, to provide an addressing architecture with reduced complexity in order to provide high production yield while maintaining the ability to reduce or eliminate successive line failures.

SUMMARY OF THE INVENTION

A decoder architecture for enabling outputs in response to clock signal inputs is described including X number of logic stages corresponding to X number of outputs of the decoder. Each of the logic stages has a plurality of inputs, wherein each logic stage includes fewer than $\log_2 X$ inputs for receiving the clock signal inputs.

In embodiments, the decoder is incorporated in an electronic device including an array having a plurality of lines of addressable elements. In embodiments, the decoder sequentially enables the lines of the array responsive to a plurality of clock signal inputs. In embodiments, each of the clock signal inputs to the decoder has a non-binary duty cycle.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which:

FIG. 1 is a circuit diagram of a prior art two input NAND logic structure;

FIG. 2 is a circuit diagram of a prior art four input NAND logic structure;

FIG. 8 is a circuit diagram of a two input NAND logic structure.

DETAILED DESCRIPTION

Figure 3:
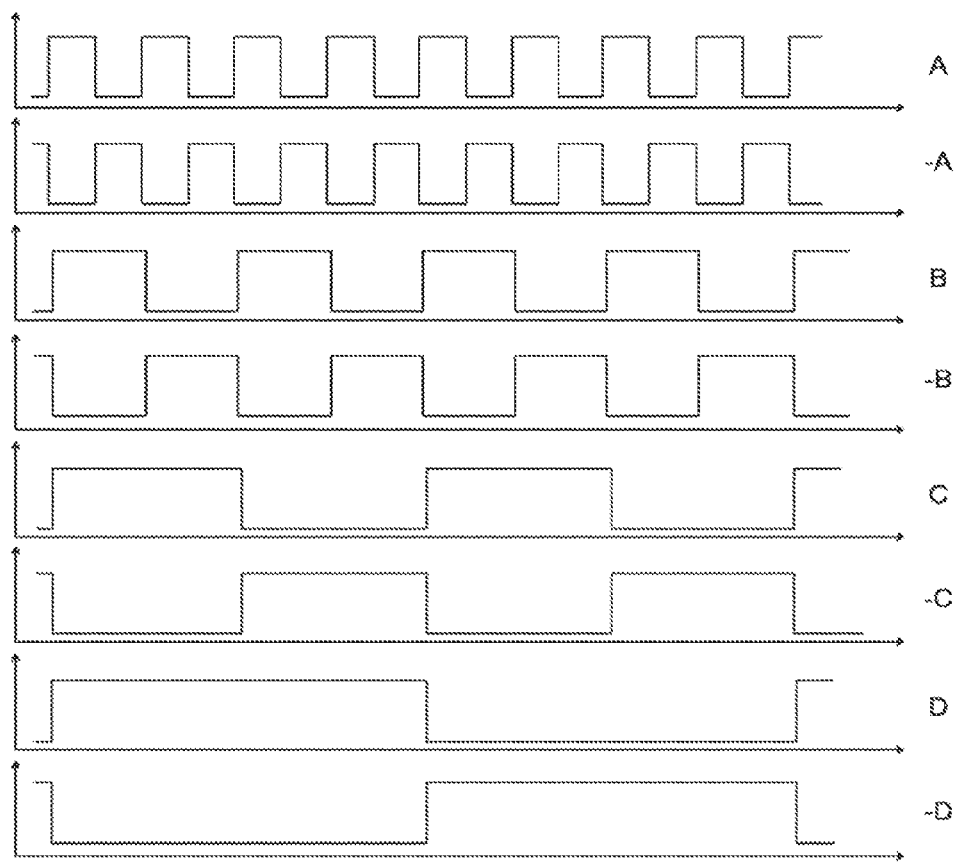
FIG. 3 is a prior art timing diagram for clock signals for a binary system with logic stages having four inputs.

This description of the exemplary embodiments is intended to be read in connection with the accompanying drawings, which are to be considered part of the entire written description.

Simplified decoder architectures and logic operations are described herein that reduce the number of components needed in each decoder stage for addressing an array. By implementing fewer devices in each stage, the circuit occupies significantly less space than conventional decoder architectures with consequent reductions in the probability of failures. The architecture provides the advantages of reduced complexity previously associated only with shift register addressing circuits but with the ability to eliminate sequential line failures.

A decoder is formed of repetitive logic stages, each of which receives a number of clock signals to enable its output. By way of example, only, the stages typically include multiple input NAND gates followed by a buffer. Each NAND gate receives clock signals through its inputs and when the correct signals are present the buffered output is enabled. Examples of these NAND gates are shown in FIGS. 1 and 2. As shown in FIG. 1, a two input NAND gate has a CMOS implementation with two NMOS transistors (labeled N1, N2) connected in series and two PMOS transistors (labeled P1, P2) connected in parallel. The number of devices in each NAND gate is equal for both NMOS and PMOS transistors and is dictated by the number of inputs for the decoder stage (i.e. every input, such as 'g1' or 'g2', is shared by one NMOS and one PMOS transistor). With reference to FIG. 2, the increased complexity of a four input (eight device) NAND gate is apparent when compared to a two input (four device) NAND gate (FIG. 1). As shown in FIG. 2, the NAND gate includes four serially connected NMOS (N1-N4) and four parallel connected PMOS (P1-P4) transistor devices.

In these prior art examples, the output of each NAND circuit is a low voltage when all the inputs (G1-Gn) are high. For this reason a signal conditioning circuit, such as a buffer inverter (not shown), is added at the end of each stage. In addition to inverting the output, this inverter also serves the function of a buffer as it can supply enough drive current to enable the addressed array. Decoders with stages including NOR gates may also be used in decoder architectures and often used in a complementary way (i.e., for outputs that assume a low level only when selected; and gates are controlled by inverse clocks to those used in NAND gates). As those skilled in this art will understand variables such as dynamic response, parasitics, CMOS or bipolar technology, etc.) determine whether NAND, NOR or other gate that has a single output state for a given combination of unique inputs.

By way of example only, the invention is described herein in connection with a system of sixteen addressable output lines. In a prior art binary system, sixteen output lines can be addressed using 4 bits ($2^4$=16). As discussed above, the decoder includes sixteen logic stages, each corresponding to a respective output of the decoder, and each of the sixteen decoder stages has four inputs that feed a logic circuit (i.e., a NAND gate) with four input signals. This logic circuit enables its output if the correct states are present at the inputs (for example, if they are all high).

Traditional decoder logics are controlled by binary clocks to enable sequential outputs. The control clocks form a combination of pulses each having a 50% duty cycle and time frequencies that relate to each other by multiples of 2. FIG. 3 is a prior art timing diagram for clock signals carried by a clock bus for a binary system with four inputs per decoder stage. Four clock signals as well as their inverted signals (i.e., their complements), for a total of eight clock signals, are shown each having a binary duty cycle of 50%. Clock signals A/–A have a frequency twice that of clock signals B/–B. Clock signals B/–B have a frequency twice that of clock signals C/–C. Last, clock signals C/–C have a frequency twice that of clock signals D/–D. Examining the timing diagram, there are sixteen possible combinations during the illustrated cycle of four clock signals (and their compliments) at which all four levels are high. For example, the third possible combination of high clocks is obtained with the following pulses: the second high level of clock A, the first high level of clock –B, the first high level of clock C, and the high level of clock D.

Figure 4:
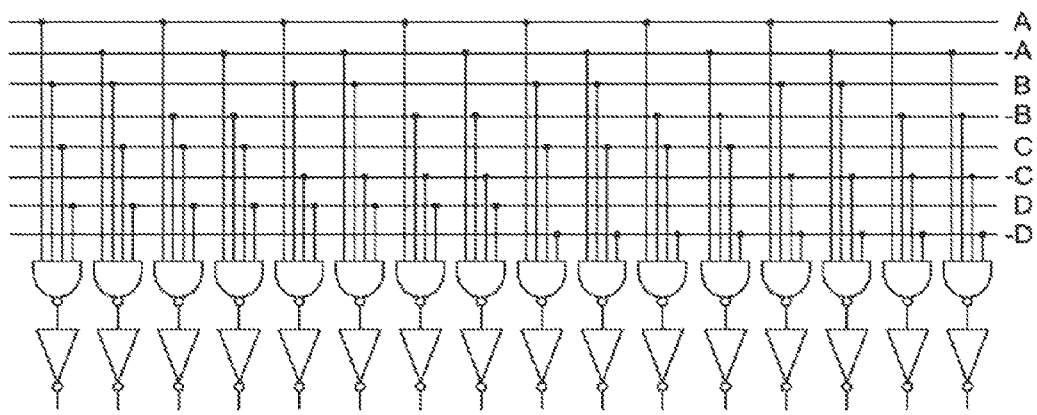
FIG. 4 is prior art circuit diagram showing the connections of the clock signals of FIG. 3 to a decoder structure having input stages with four inputs for enabling sixteen outputs.

Connecting the decoder stages to the correct clock lines enables the outputs of the sixteen stages sequentially. By "sequentially" it is meant the outputs are controlled by clock signals, i.e., controlled by the sequential changes in the polarity of the clock signals, rather than by providing individual addresses to the decoder in response to some other stimulus. "Sequentially" does not imply that the decoder must be wired to the array in such a way that the array lines or columns are sequentially triggered (i.e., meaning adjacent ones triggered one after the other). Some applications may also be addressed in a non-sequential manner. FIG. 4 shows the connections of each one of the four inputs of every stage in the decoder to the correct clock line. For example, the third stage of the decoder has its inputs connected to clock line A, clock line -B, clock line C and clock line D. This connection enables the third stage of the system only when all four of the lines are high, i.e., at the third possible combination of high clocks as shown in the clock diagram of FIG. 3.

Figure 5:
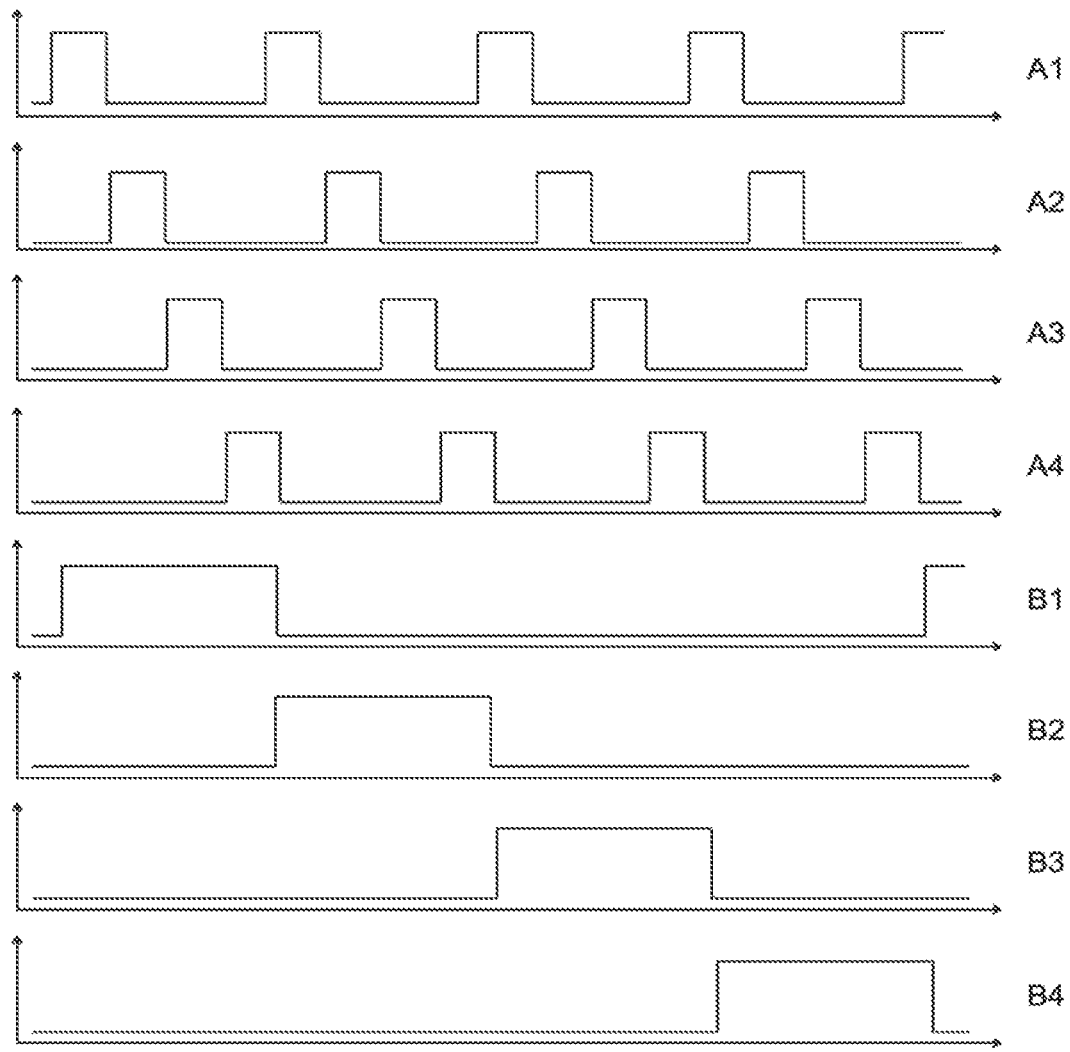
FIG. 5 shows a timing diagram according to one embodiment of the present invention for clock signals for a base four system with logic stages having two inputs.
Figure 6:
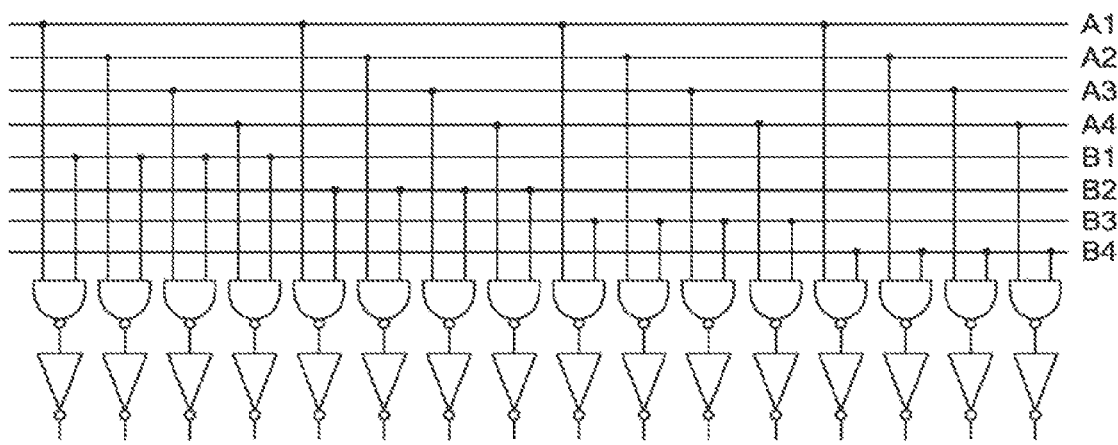
FIG. 6 shows an embodiment of a decoder according to one embodiment of the present invention which utilizes the improved clocking signals of FIG. 5.

In embodiments of the present invention, the time basis is modified in order to accommodate more possible logic states per clock signal. This approach effectively reduces the number of inputs required for each logic element (e.g., for each NAND gate). In embodiments, the duty cycle of the control clocks is changed to a non-binary duty cycle, thereby fitting more pulses per clock period. By "non-binary duty cycle" it is meant that the duty cycle is different than 50%. The duty cycle may be less than 50% or even greater than 50% depending on the polarity of interest for the given architecture. For example, changing the duty cycle of the clock from 50% to 25% effectively allows for a base clock to assume four states instead of two, making the clock non-binary. The logic becomes base four and sixteen address outputs in a decoder system are possible by utilizing only two inputs per logic gate ($4^2$=16). FIGS. 5 and 6 illustrates this point. FIG. 5 shows the timing diagram for the clock signals for a base four decoder system with each logic stage having two inputs. In this example, there are two base clocks with duty cycle set to 25%, which effectively allows for each base clock to assume 4 states instead of 2. In other words, four clock lines based on a given pulse width can be described as a time shift of 25% to the previous pulse. The timing diagram shows base clocks A and B at their four possible states to form 8 clock lines (A1-A4 and B1-B4 respectively). Clock signals B1-B4 have a period four times greater than clock signals A1-A4. In this fashion, they define sixteen possible combinations of two clock lines at which both levels are high. For example, the third possible combination of high clocks can be obtained by the following: the first high level of clock A3 with the first high level of clock B1.

FIG. 6 is a circuit diagram of a decoder according to an embodiment of the present invention including sixteen two-input NAND decoder stages and their respective connections to clock lines providing the clock signals shown in FIG. 5. As can be seen from FIG. 6, the third stage of the decoder has its inputs connected to clock line A3 and clock line B1. This connection enables the third stage of the system when both lines are high (i.e., the third possible combination of high clocks as shown in the timing diagram of FIG. 5). By connecting the decoder to the correct clock lines, all sixteen stages are enabled sequentially during a clocking cycle. The significant reduction in complexity, when compared with the decoder of FIG. 4, can be seen in the reduced connection complexity reflected in FIG. 6 and by comparing the complexity of individual two input NAND gates (FIG. 1) with that of four input NAND gates (FIG. 2). It should be apparent that the decoder of FIG. 6 utilizes sixty-four fewer transistors than the decoder of FIG. 4 (i.e., 4 fewer transistors per NAND gate). The space savings are very significant when the decoder architecture is implemented in large area arrays, which can include hundreds to thousands of lines of addressable elements. Reducing complexity, and thus risk of defect, is of particular importance in these large area arrays as only limited numbers of such arrays can be fabricated on a given substrate. Any significant defect in a given array, therefore, can significantly adversely affect yield.

By way of example only, additional reductions in complexity could be achieved using a NAND gate such as that shown in FIG. 8, which is similar to the NAND gate of FIG. 1 only a resistor R is used instead of PMOS gates P1 and P2. It should be understood that other decoder structures compatible with this invention may be similar to, but are not restricted to, the ones shown in FIGS. 1, 2 and 8 and may be based on NAND, NOR, PMOS only, NMOS only, or other designs. They may also be used in conjunction with buffers or switches at the output to increase voltage, current, or both. The type of logic gate used is not essential. Rather, the clock management techniques disclosed herein provide for the desired reductions in circuit complexity for a selected decoder architecture.

Similar to standard binary decoders, the number "X" of addressable outputs is computed as a power of a number. The number "Y" of states per clock is the base and the exponent is the number "G" of inputs needed per logic element (e.g., per NAND gate). Using simple mathematics, the required bus size (number of clock lines) can be calculated. The bus size follows a linear law and is computed as the number of states per clock multiplied by the number of inputs per logic element (i.e., Y*G).

In general terms, the decoder for sequentially accessing the addressable elements of an array of addressable elements in a sequential order is responsive to a plurality of clock inputs. If the decoder has "X" number of outputs corresponding to the "X" number of columns or lines (collectively referred to herein as "lines") in an array coupled to the decoder, then the decoder includes "X" number of logic stages (e.g., NAND gates) corresponding to the "X" number of outputs of the decoder. In contrast to the prior art decoder of FIG. 4, each logic stage includes fewer than $\log_2 X$ number of inputs for receiving clock signal inputs. The reduction in number of required inputs per logic stage is enabled by reducing the duty cycle of the clock inputs as discussed above and provides a significant reduction in the complexity of the logic stages. In embodiments, the duty cycle of the clock signal equals, as a percentage, 1/Y where Y is the number of states per clock and conforms to the equation $\log_Y X = G$, G being the number of inputs at each logic stage for receiving the clock inputs. So, if the number of outputs X equals 64, and the number of gates of each NAND logic element is 3, then Y equals 4 (i.e., $4^3 = 64$) and the required duty cycle for the clock signals is 100% times ¼, i.e., 25%.

It should be apparent that a large range of possibilities arise when changing the logic base of a decoder from 2 to a number greater than 2. A reduction of decoder complexity at each stage can be achieved, which can increase production yields and minimize the probability of large failures.

In some applications, it may be convenient to minimize the number of inputs (and thus decoder stage complexity) for a given fixed number of required outputs (as in the example described above with fixed sixteen addressable outputs). This becomes particularly useful when the number of addressable outputs is high. For example, in order to address 512 lines using a prior art decoder of FIGS. 3 and 4, one requires 9 binary inputs ($2^9 = 512$) for each of the 512 logic stages. However, using a time base 8 instead, the number of required inputs is only 3 ($8^3 = 512$) for each of the 512 logic stages. By "time base 8" it is meant that each clock as a 12.5% duty cycle. In this example, the decoder stages, such as the NAND stages shown in FIGS. 1 and 2, would each only have a total of six transistor devices for base 8 instead of eighteen devices for base 2. The trade off in this scenario is the increase in bus size from 18 (2×9=18 for base 2) to 24 (8×3=24 for base 8). In this example, twenty-four input clock signals are provided by the busses, which conform to the following relationships: (1) each clock as a duty cycle of 12.5%; (2) clocks A1-A8, B1-B8 and C1-C8 are provided; (3) clocks A2-A8, B2-B8 and C2-C8 represent delayed instances of clocks A1, B1 and C1, respectively (see, e.g., FIGS. 5); and (4) clocks B2-B8 have a period eight times that of clocks A1-A8 and clocks C2-C8 have a period eight time that of clocks B2-B8. The increase in bus size is negligible when compared to the difference in number of transistor devices: 3072 (6×512) for base 8 and 9216 (18× 512) for base 2. It is important to point out that bus size increase is not a serious concern in most applications, as bus lines are simple metal traces that do not largely impact yield. Typically, the cost of implementing high numbers of gates per decoder stage (i.e., increased area, reduced yield, etc.) is larger than the cost of introducing extra clock lines.

In other applications, it may be convenient to maximize the number of addressable outputs for a given fixed number of gates. For example, in a standard binary system with 12 bits one can address only 4096 outputs ($2^{12} = 4096$). However, with a time base 3 (i.e., duty cycle of 33 ⅓ percent, meaning three states per clock cycle) one can address 531441 outputs ($3^{12} = 531441$) with the same number of bits (i.e., same number of inputs per decoder stage). This is a very large increase in total addressable outputs, which can have a dramatic effect on system performance and efficiency. Just as with the previous case, the trade off in this scenario is the increase in bus size from 24 (2×12=24 for base 2) to 36 (3×12=36 for base 3). However, if one wanted to address over 500000 lines with a standard binary system, 19 bits would be required and a total of 38 clock bus lines needed, actually providing a less complex bus structure for this given number of outputs.

Although a preferred embodiment shown here is based on decoder stages with NAND gates, the above-described mathematical formulation does not imply any requirement on the composition of the logic inside each decoder stage. As mentioned above, NOR gates could also be used. Moreover, the decoder architecture and logic can be implemented with any logic gate that defines a single output state for a unique combination of inputs.

It is clear that in many applications the alternative decoder architecture and logic operation discussed herein can significantly reduce circuit complexity, either at the decoder stage level or the clock bus level. In particular, this is of great value to large area applications such as sensors and displays where reduced circuit complexity is required to achieve high yield over an extensive area. The increased efficiency in decoder stage and better utilization of clock signals provides the necessary addressing power for large systems at a reduced risk.

As mentioned above, the decoding architecture described herein can be used with any type of addressable array, such as memory cluster, display or sensor array. In exemplary embodiments, the decoding architecture is used with a sensor array. These sensor arrays can be used for a variety of acquisition functions such as thermal measurements, x-ray detection, and pressure sensing, to name a few. These devices are used in diverse fields including medical, environmental, security and industrial, amongst others. Development and commercialization of these sensing arrays are usually dictated by the cost of the processing technology used to build them as well as their sensing accuracy. Because these sensors are built over a large area, selecting a suitable technology that can provide appropriate yields with little area consumption at an acceptable cost is often difficult.

The most efficient and accurate sensing arrays are based on active principles. Active sensors quantify a specific physical parameter response to a given stimulus. For example, active thermal sensors measure an object's heat conductance for a given heating stimulus. The response to the stimulus is measured by each of the sensing sites within a sensor array. The response is in part a function of the stimulus provided, i.e., the larger the stimulus, the larger the response. Examples of sensors of this type are disclosed in U.S. Pat. No. 6,091,837 to Dinh, entitled "Sensor for Acquiring a Fingerprint Image Based on Heat Transfer" (hereinafter "Dinh I") and WO 2006/033582 A1, also to Dinh, entitled "Apparatus for Fingerprint Sensing and Other Measurements" (hereinafter, "Dinh II"), the entirety of each of which is hereby incorporated by reference herein.

Figure 7:
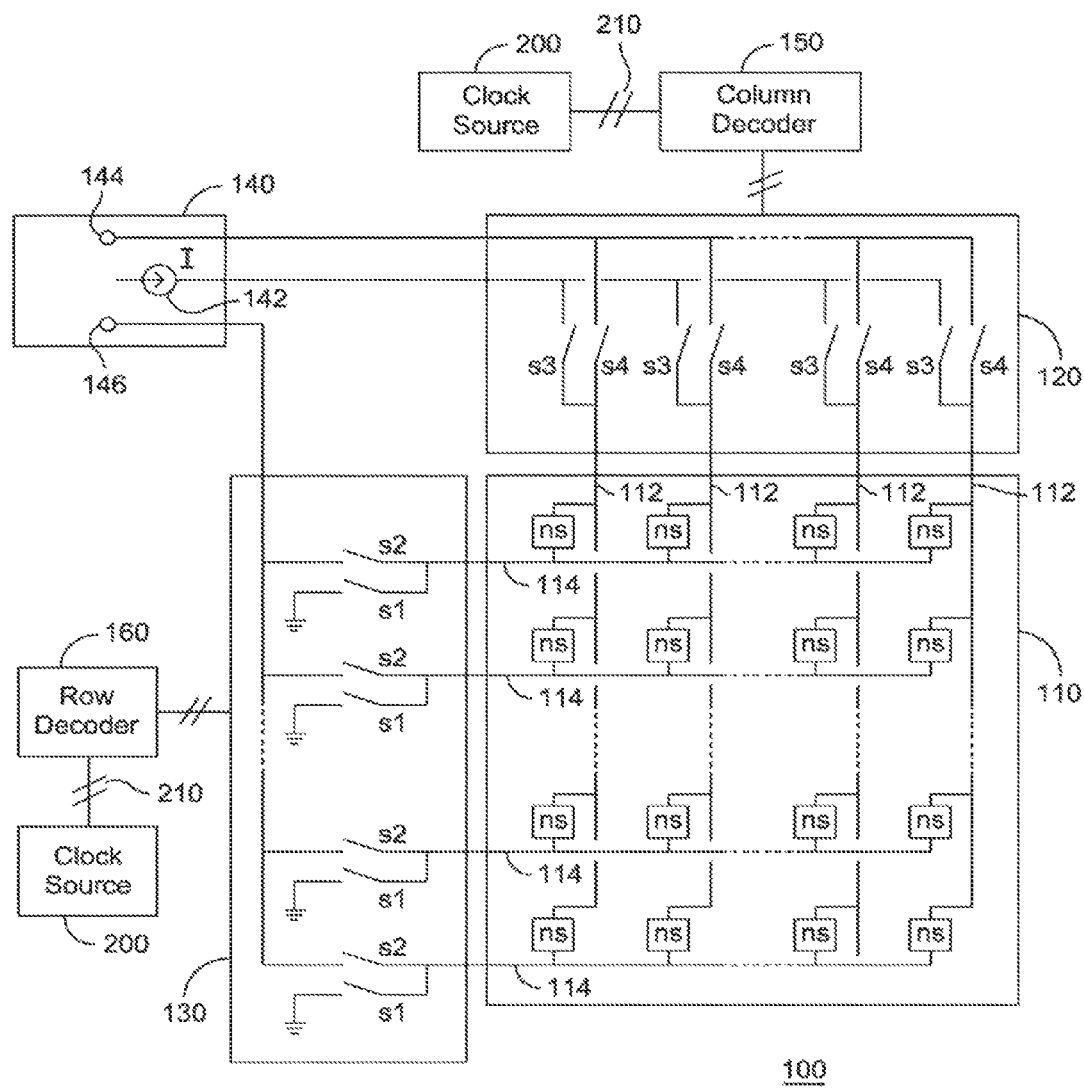
FIG. 7 shows a sensing array having switching structure for selectively biasing and reading pixel sites and a decoding structure coupled thereto for enabling columns and lines of the array.

FIG. 7 shows a sensing apparatus 100 including a sensor array 110 formed of nonlinear sensing pixels "ns" as well as surrounding row and column switching circuits. Reference 112 identifies column lines and reference 114 identifies row lines. Each sensing site has a column terminal connected to a column line 112 and a row terminal connected to a row line 114. Block 140 provides the stimulus current from a current source 142 for each pixel site in the array 110. The biasing current is directed into the correct column lines 112 by thin film transistor (TFT) switches 's3,' which can be multiplexed by a decoder. When a column 112 is selected, the TFT switch s3 connects the respective column line 112 to the current source 142, thereby allowing the stimulus current to flow into the pixel site. When the column is deselected, the corresponding TFT switch is connected to ground (not shown) to ground the column line. In a similar fashion, row lines are activated by TFT switches 's1'. These switches are connected to ground when a row line is selected, allowing the current to flow out of the pixel site after it flows through the pixel 'ns'. When a row is deselected, the corresponding TFT switch 's1' connects the row line to a high potential (not shown), reverse biasing the pixels connected to the deselected row.

Column and row decoders 150, 160 are provided for controlling switches s3, s4 and s1, s2, respectively, of column switching module 120 and row switching module 130. These decoders preferably take the form of those described above in connection with FIGS. 5 and 6 (modified of course to decode for the desired number of lines/columns), so that individual lines and columns can be enabled to allow individual sensing elements can be sequentially accessed. The row and column decoders 150, 160 are provided clock signals through clock busses 210 from clock sources 200. In an exemplary embodiment, the column and row decoders 150, 160 are integrated on the same substrate as the array 110, switch modules 120, 130 and clock busses 210. In embodiments, the clock sources 200 are external to this structure though in other embodiments could be integrated on the substrate along with the other illustrated structures. Non-limiting examples of external clocks include external clock chips, computers, microprocessors and PLCs.

In this sensor 100, the data signal that is present at each pixel (i.e., the differential voltage signal) is detected from the array 100 by a differential reading circuit (not shown) coupled to two high impedance nodes 144, 146 in block 140, which are connected to column lines 112 and row lines 114, respectively, through two large TFT transistors 's4' and 's2,' respectively.

Although an embodiment of the invention is described in connection with a sensor array as shown in FIG. 7, it should be understood as described above that the decoder architecture and decoding method as disclosed herein can be used with other arrays, such as memory arrays and display arrays, as will be readily understood by those of ordinary skill in the art.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of decoding, comprising:
providing an array including a plurality of lines of addressable elements;
providing a decoder for sequentially enabling the lines of the array responsive to a plurality of clock signal inputs; and
providing the plurality of clock signal inputs to the decoder to sequentially enable outputs of the decoder, wherein one or more of the clock signal inputs has a non-binary duty cycle.

2. The decoding method of claim 1, wherein the decoder comprises X number of outputs corresponding to the plurality of lines of the array, the decoder comprising X number of logic stages corresponding to the X number of outputs of the decoder, wherein each logic stage comprises fewer than $\log_2 X$ inputs for receiving the clock signal inputs.

3. The decoding method of claim 2, wherein the array and decoder are integrated on a common substrate.

4. The decoding method of claim 3, wherein a clock bus is integrated on the common substrate for providing the clock signal inputs to the logic stages.

5. The decoding method of claim 4, further comprising the step of providing the plurality of clock signal inputs from an external clock.

6. The decoding method of claim 2, wherein the duty cycle equals, as a percentage, 1/Y where Y conforms to the equation $\log_y X = G$ and G is the number of inputs at each logic stage for receiving the clock signal inputs.

7. The decoding method of claim 2, wherein each of the logic stages includes a logic gate that assumes a single output state for a unique combination of inputs.

8. The decoding method of claim 7, wherein each logic stage further includes an output signal conditioning circuit coupled to an output of its logic gate.

9. The decoding method of claim 1, wherein each of the clock signal inputs has a duty cycle of less than 50%.

10. A sensing method for a sensing device having an active sensor array comprising a plurality of lines of addressable sensing elements, comprising the steps of:
providing a row column decoder for sequentially enabling the lines of the active sensor array responsive to a plurality of clock signal inputs;
providing the plurality of clock signal inputs to the row decoder to sequentially enable outputs of the row decoder, wherein one or more of the clock signal inputs has a non-binary duty cycle; and sequentially accessing the lines of addressable sensing elements of the active sensor array responsive to the outputs of the row decoder.

11. The sensing method of claim 10, wherein the active sensor array comprises a plurality of rows and lines of addressable sensing elements, the method further comprising:

providing a column decoder for sequentially enabling the columns of the active sensor array responsive to a plurality of clock signal inputs for the column decoder;

providing the plurality of clock signal inputs for the column decoder to the column decoder to sequentially enable outputs of the column decoder, wherein one or more of the clock signal inputs has a non-binary duty cycle; and sequentially accessing the columns of addressable sensing elements of the active sensor array responsive to the outputs of the column decoder.

12. The method of claim 10, wherein the active sensor array is an active thermal sensing array.

13. The method of claim 12, wherein each addressable sensing element comprises a sensing pixel, and the method includes activating and reading each sensing pixel.

14. The method of claim 13, wherein each sensing pixel comprises a nonlinear sensing element.

15. The method of claim 10, wherein the row decoder comprises X number of outputs corresponding to the plurality of lines of the active sensor array, the row decoder comprising X number of logic stages corresponding to the X number of outputs of the row decoder, wherein each logic stage comprises fewer than $\log_2 X$ inputs for receiving the clock signal inputs.

16. The method of claim 15, wherein the array and row decoder are integrated on a common substrate.

17. The method of claim 16, wherein a clock bus is integrated on the common substrate for providing the clock signal inputs to the logic stages.

18. The method of claim 17, further comprising the step of providing the plurality of clock signal inputs from an external clock.

19. The method of claim 15, wherein the duty cycle equals, as a percentage, 1/Y where Y conforms to the equation $\log_y X = G$ and G is the number of inputs at each logic stage for receiving the clock signal inputs.

20. The decoding method of claim 15, wherein each of the logic stages includes a logic gate that assumes a single output state for a unique combination of inputs.

\* \* \* \* \*